US010037866B2

(12) United States Patent
Enyama et al.

(10) Patent No.: US 10,037,866 B2
(45) Date of Patent: Jul. 31, 2018

(54) CHARGED PARTICLE BEAM APPARATUS

(71) Applicant: HITACHI HIGH-TECHNOLOGIES CORPORATION, Minato-ku, Tokyo (JP)

(72) Inventors: Momoyo Enyama, Tokyo (JP); Muneyuki Fukuda, Tokyo (JP); Hideyuki Kazumi, Tokyo (JP); Koichi Hamada, Tokyo (JP); Sayaka Tanimoto, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/217,460

(22) Filed: Jul. 22, 2016

(65) Prior Publication Data
US 2017/0025251 A1    Jan. 26, 2017

(30) Foreign Application Priority Data

Jul. 24, 2015  (JP) .................................. 2015-146549

(51) Int. Cl.
*H01J 37/26* (2006.01)
*H01J 37/22* (2006.01)

(52) U.S. Cl.
CPC .......... *H01J 37/265* (2013.01); *H01J 37/226* (2013.01); *H01J 2237/049* (2013.01); *H01J 2237/103* (2013.01); *H01J 2237/2801* (2013.01)

(58) Field of Classification Search
CPC .. H01J 37/265; H01J 37/226; H01J 2237/049; H01J 2237/103; H01J 2237/2801
See application file for complete search history.

(56) References Cited

U.S. PATENT DOCUMENTS

| 5,500,527 A * | 3/1996 | Zarubin ................ H01J 37/265 250/311 |
| 7,915,597 B2 * | 3/2011 | Huang .................... H01J 37/20 250/396 R |
| 2002/0079448 A1 | 6/2002 | Ishitani et al. |
| 2004/0021845 A1 | 2/2004 | Kawahara |
| 2005/0247884 A1 | 11/2005 | Nakamura et al. |
| 2016/0057337 A1 | 2/2016 | Shimano et al. |

FOREIGN PATENT DOCUMENTS

| JP | 2002-124205 A | 4/2002 |
| JP | 2004-063988 A | 2/2004 |
| JP | 2005-302359 A | 10/2005 |
| JP | 2014-197115 A | 10/2014 |

\* cited by examiner

*Primary Examiner* — Jason McCormack
*Assistant Examiner* — Sean Luck
(74) *Attorney, Agent, or Firm* — Miles & Stockbridge P.C.

(57) ABSTRACT

A charged particle beam apparatus with improved depth of focus and maintained/improved resolution has a charged particle source, an off-axis illumination aperture, a lens, a computer, and a memory unit. The apparatus acquires an image by detecting a signal generated by irradiating a sample with a charged particle beam caused from the charged particle source via the off-axis illumination aperture. The computer has a beam-computing-process unit to estimate a beam profile of the charged particle beam and an image-sharpening-process unit to sharpen the image using the estimated beam profile.

14 Claims, 12 Drawing Sheets

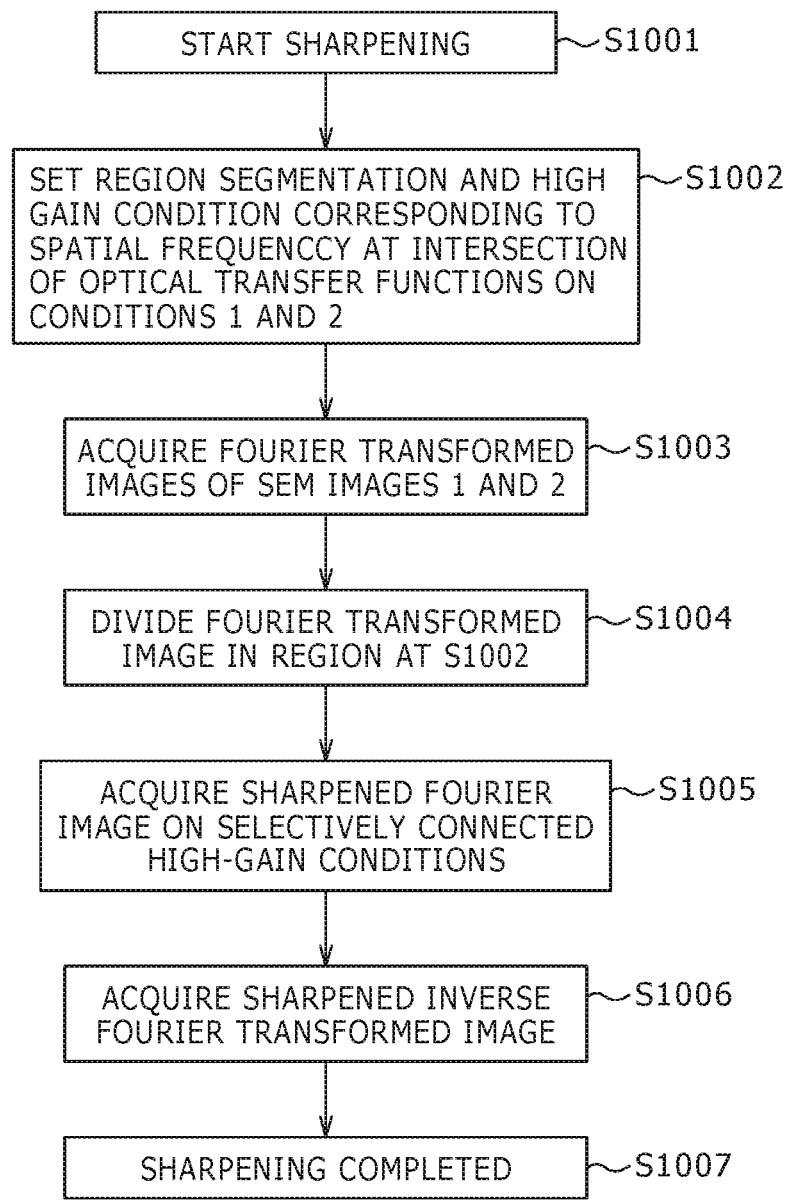

FIG.11A  FIG.11B  FIG.11C
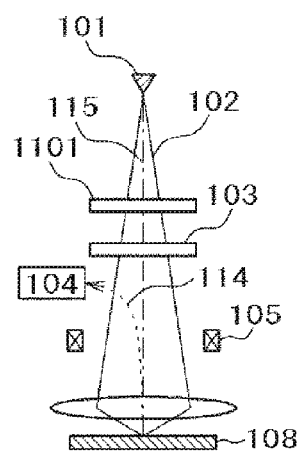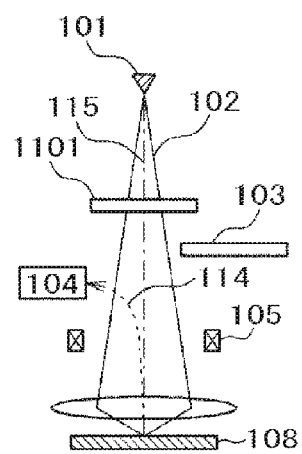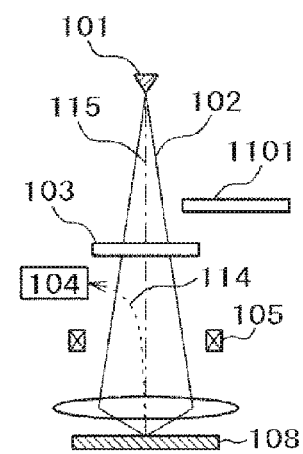
FIG.11D  FIG.11E  FIG.11F
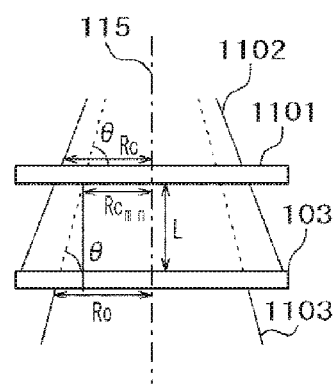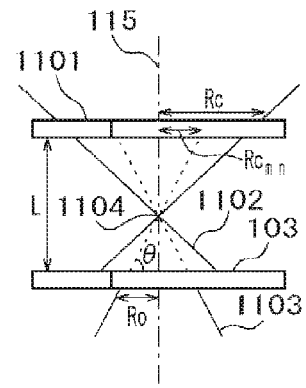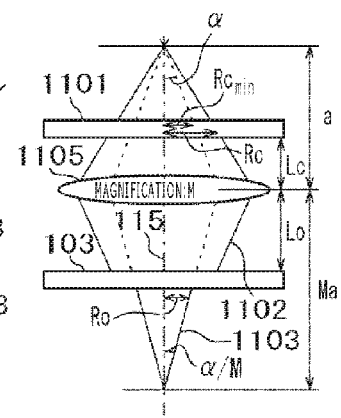

CHARGED PARTICLE BEAM APPARATUS

CLAIM OF PRIORITY

The present application claims priority from Japanese patent application JP 2015-146549 filed on Jul. 24, 2015, the content of which is hereby incorporated by reference into this application.

BACKGROUND

The present invention relates to a charged particle beam apparatus.

In manufacturing process of semiconductor devices and magnetic disks, a charged particle beam measuring device to measure the shape and size of a pattern formed on a sample, and a charged particle beam inspecting device to examine presence/absence of defect, are used. These devices irradiate the sample with a charged particle beam (hereinbelow, a primary beam) such as an electronic beam or ion beam and acquire a secondary charged particle signal such as secondary electrons caused by the irradiation. As such charged particle beam device, a scanning electron microscope (SEM) device has been conventionally used.

In recent years, miniaturization of semiconductor devices is approaching the limit, and as high-integration in place of the miniaturization, three-dimensional device structure is promoted. Upon inspection and measurement of three-dimensional device, it is required to acquire information on the both of the highest part and the lowest part of the uneven sample surface. Accordingly, it is necessary to increase the focus of depth of the SEM. The depth of focus is an allowable range of shift from just focus state upon observation. The blur of electron beam due to focus shift increases in accordance with opening angle of the electron beam on the sample. To increase the depth of focus, it is necessary to reduce the opening angle. However, when the opening angle is reduced, a diffraction aberration, caused by electron wave nature, which becomes smaller in inversely proportional to the opening angle, is increased. Thus there is a physical limitation that the resolution is degraded. That is, the depth of focus and the resolution are in trade-off relationship.

In projection exposure devices, as means for improving the depth of focus, an off-axis-illumination technique of providing an aperture with a light shielding plate on an optical axis of an optical system is proposed. For example, Japanese Unexamined Patent Application Publication No. 2004-63988 shows openings to form various effective light source topographies in addition to an annular aperture and a quadrupole aperture. Further, Japanese Unexamined Patent Application Publication No. 2002-124205 shows, among these off-axis-illuminations, as an application of annular illumination to a charged particle beam device, gathering an electron beam passed through the annular aperture in a probe shape. According to this method, it is possible to provide a scanning charged particle microscope with improved resolution and improved depth of focus.

Further, as a high resolution optical photography, deconvolution is known. The deconvolution is eliminating only beam profile information from an acquired image to sharpen the original image. For example, Japanese Unexamined Patent Application Publication No. 2014-197115 shows homogenizing blur of a dot image with respect to focus shift by, in a pupil plane of an image-sensing camera optical system, applying phase distribution given as a three-dimensional function to pupil plane coordinates, and eliminating the homogeneous blur by deconvolution, to enlarge the depth of field and the depth of focus of the optical system. Note that the annular structure shown in Japanese Unexamined Patent Application Publication No. 2014-197115 corresponds to rotation symmetric phase distribution. It is necessary to pay attention that the annular structure is different from the annular aperture shown in Japanese Unexamined Patent Application Publication Nos. 2004-63988 and 2002-124205. Further, Japanese Unexamined Patent Application Publication No. 2005-302359 shows application of deconvolution to a charged particle beam device.

SUMMARY

The inventors have focused on an annular aperture advantageous in the field of optics so as to acquire an excellent sample surface image from even a minute sample having a highly uneven surface. They have studied the charged particle beam device having the annular aperture disclosed in Japanese Unexamined Patent Application Publication No. 2002-124205. As a result, they have found that the depth of focus is improved however the resolution is degraded (regardless of definition). Accordingly, the inventors have further studied about the cause of resolution degradation and a countermeasure to mitigate the degradation.

For example, in a beam profile formed upon use of off-axis-illumination such as annular illumination or quadrupole illumination, in comparison with general illumination, the main peak is thinner but the side robe is higher. Accordingly, it is considered that the seeming resolution of the acquired SEM image is degraded, and as a solution, deconvolution to eliminate beam profile information from the SEM image is effective. In the deconvolution, it is necessary to previously acquire a beam profile for image formation. However, there is no scheme to directly measure the SEM beam profile. Further, when the deconvolution is applied to a noisy SEM image, the high frequency noise is increased.

The object of the present invention is to provide a charged particle beam device with both of improved depth of focus and maintained and improved resolution.

As an aspect of the present invention to attain the above object, provided is a charged particle beam device including: a charged particle source; an off-axis illumination aperture; a lens; a computer; and a memory unit, in which a signal, generated by irradiating a sample with a charged particle beam caused from the charged particle source via the off-axis illumination aperture and the lens, is detected, so as to acquire an image, and in which the computer has: a beam-computing-process unit that performs a beam computation process to estimate a beam profile of the charged particle beam; and a sharpening process unit that performs a sharpening process to sharpen the image using the estimated beam profile.

Further, there is provided a charged particle beam device including: a charged particle source; an off-axis illumination aperture; an objective lens; a controller including a computer and a memory unit; and an input/output unit including a display unit, in which an image is acquired by detecting a signal, generated by irradiating a sample with a charged particle beam caused from the charged particle source via the off-axis illumination aperture and the objective lens, and in which the computer has: a beam-computing-process unit that performs a beam computation process to estimate a beam profile of the charged particle beam; and a sharpening process unit that performs a sharpening process to sharpen the image using the estimated beam profile, and in which the display unit displays a reconstructed image of the image sharpened using the estimated beam profile.

According to the present invention, it is possible to provide a charged particle beam device with both of improved depth of focus, and maintained and improved resolution.

BRIEF DESCRIPTION OF THE DRAWINGS

FIG. 10 is a flowchart showing the flow of sharpening in the charged particle beam device according to the third embodiment;

FIG. 11A is a block diagram showing a schematic configuration of the charged particle beam device (electron beam observation device) according to a fourth embodiment when a circular aperture and an off-axis illumination aperture are used;

FIG. 11B is a block diagram showing a schematic configuration of the charged particle beam device (electron beam observation device) according to the fourth embodiment when the off-axis illumination aperture is withdrawn and only the circular aperture is used;

FIG. 11C is a block diagram showing a schematic configuration of the charged particle beam device (electron beam observation device) according to the fourth embodiment when the circular aperture is withdrawn and only the off-axis illumination aperture is used;

FIG. 11D is a partially enlarged view of FIG. 11A, where the circular aperture and the off-axis illumination aperture are irradiated with a primary beam while the primary beam is radially spreading;

FIG. 11E is a partially enlarged view of FIG. 11A, where cross over is caused between the circular aperture and the off-axis illumination aperture irradiated with the primary beam;

FIG. 11F is a partially enlarged view of FIG. 11A, where a lens is provided between the circular aperture and the off-axis illumination aperture;

DETAILED DESCRIPTION

Figure 1:
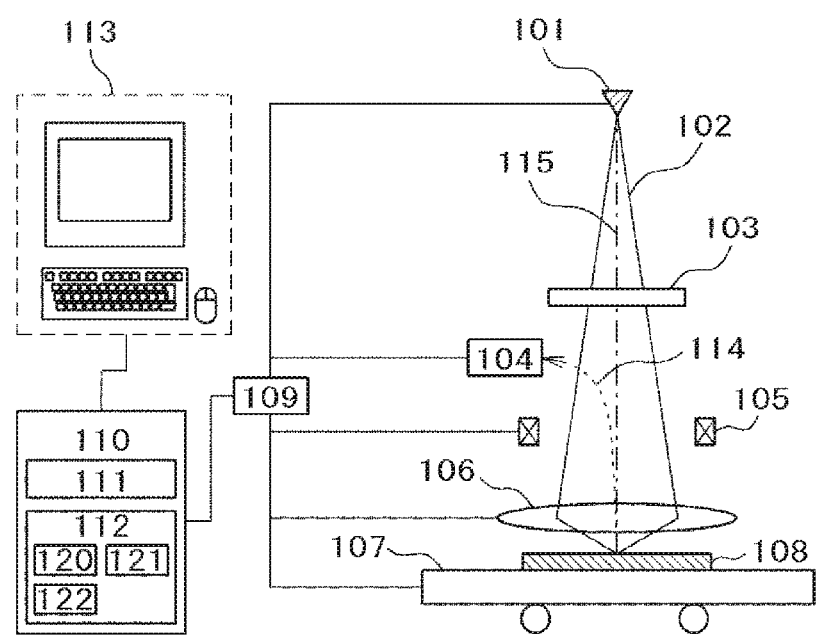
FIG. 1 is a block diagram explaining the entire schematic configuration of a charged particle beam device (electron beam observation device) according to a first embodiment of the present invention.

Hereinbelow, various embodiments of the present invention will be described in detail based on the drawings. Note that in all the drawings for explanation of the embodiments, the same elements have the same reference numerals, and repetitive explanations will be omitted. Hereinbelow, embodiments in a sample observation/inspection device using an electron beam will be shown. Even when an ion beam is used or when a measuring device or a general electronic microscope is used, the advantageous features of the present invention will not be lost.

First Embodiment

A charged particle beam device according to a first embodiment will be described using FIGS. 1, 2A to 2H, and 3 to 7.

First, the configuration of the charged particle beam device will be described with an electron beam observation device as an example. FIG. 1 is a block diagram showing the schematic entire configuration of the electron beam observation device according to the present embodiment. In a downstream direction where an electron beam 102 is drawn from an electron source 101, an off-axis illumination aperture 103, a detector 104, a scanning deflector 105, and an objective lens 106 are provided. Further, an aligner for adjustment of the central axis (optical axis) of a primary beam, an aberration corrector and the like (not shown) are added to an electronic optical system. Note that the objective lens 106 according to the present embodiment is an electromagnetic lens for focus control with an excitation current. The objective lens 106 may be an electrostatic lens, or may be a compound lens of the electromagnetic lens and the electrostatic lens. A stage 107 moves with a wafer i.e. sample 108 placed on the stage. The electron source 101, the detector 104, the scanning deflector 105, the objective lens 106, and the stage 107 are connected to a controller 109. Further, the controller 109 is connected to a system controller unit 110.

The system controller unit 110 functionally has a memory unit 111 and a computer 112. An I/O unit 113 having a display device is connected to the system controller unit 110. Further, although not shown, it goes without saying that the constituent elements other than control system and circuit system are provided in a vacuum container, and they are operated in the evacuated container. Further, it goes without saying that the charged particle beam device has a wafer conveyance system to place a wafer, from the outside the vacuum container, onto the stage.

Note that more particularly, the system controller unit 110 has the computer 112 as a central processing unit and the memory unit 111 as a storage. The central processing unit as the computer 112 executes a program or the like stored in the memory unit 111, to perform image processing related to defect inspection and dimensional measurement or control of the controller 109. In the present specification, the system controller unit 110, the I/O unit 113, the controller 109 and the like may be generally referred to as a controller. Further, in the I/O unit 113, an input unit such as a keyboard and a mouse and a display unit such as a liquid crystal display device may be independent elements as input unit and output unit. Otherwise, an integrated input/output unit utilizing a touch panel or the like may be used. Note that reference numeral 120 denotes a beam-computing-process unit to estimate a beam profile; 121, an image-sharpening-process unit to sharpen an image using the estimated beam profile; and 122, a comparison-computing-process unit to perform comparison as to whether or not a first reconstructed image obtained by sharpening process using a first estimated beam profile and a second reconstructed image obtained by sharpening process using a second estimated beam profile are the same (within an allowable range).

Next, image observation performed with the electron beam observation device according to the present embodiment will be described. The electron beam 102 discharged from the electron source 101 is focus-controlled with the objective lens 106 and gathered on the sample 108 such that its beam diameter is a minimum. The scanning deflector 105 is controlled with the controller 109 such that the electron beam 102 scans a predetermined region of the sample 108. The electron beam 102, which has arrived at the surface of the sample 108, interacts with materials in the vicinity of the surface. With this interaction, secondary electrons such as reflected electron, secondary electron and Auger electron occur from the sample and become a signal to be acquired. In the present embodiment, the signal is a secondary electron. A secondary electron 114, caused from the position where the electron beam 102 has arrived at the sample 108, is detected with the detector 104. Signal processing is performed on the secondary electron 114 detected with the detector 104 in synchronization with a scan signal sent from the controller 109 to the scanning deflector 105, thus an SEM image is formed and observation of the sample 108 is conducted. Note that in the present embodiment, the detector 104 is provided upstream of the objective lens 106 and the scanning deflector 105, however, the order of the arrangement may be reversed. Further, although not shown, an aligner to correct an optical axis of the electron beam is provided between the electron source 101 and the objective lens 106. Correction is performed when the central axis of the electron beam is shifted with respect to an aperture or the electronic optical system.

Note that in the present embodiment, the off-axis illumination aperture 103 is provided between the current-limit electron source 101 and the sample 108. With this configuration, a desired electron beam is selected and passed through the aperture. When it is assumed that there is no aberration in the optical system of the electron beam device, a beam profile shape of the electron beam on the sample is uniquely determined as a power spectrum (the square of the absolute value of Fourier transformation) of the aperture shape of the off-axis illumination aperture 103.

[Expression 1]

$$P=|FT(A)|^2 \quad (1)$$

In the expression 1, A is an aperture shape; P, a beam profile; and FT, Fourier transformation. The diffraction aberration is represented as a spread size of the beam profile. It is obtained from expansion and contraction of the spread by multiplying the expression 1 with the ratio of a wavelength $\lambda$ to an opening angle $\alpha$. From the expression 1, it is possible to control the diffraction aberration with various aperture shapes of the off-axis illumination aperture 103.

Figure 2A:
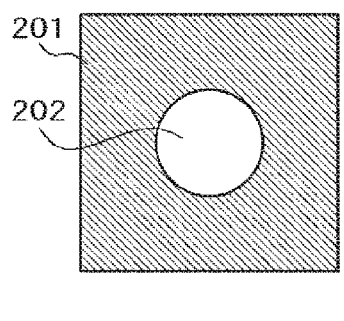
FIG. 2A is a plane diagram showing an aperture shape of a conventional circular aperture as an illumination aperture shape used in a conventional charged particle beam device.
Figure 2B:
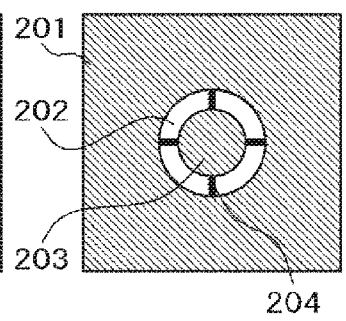
FIGS. 2B to 2H are plane diagrams showing respective off-axis illumination aperture shapes used in the charged particle beam device according to the first embodiment.
Figure 2C:
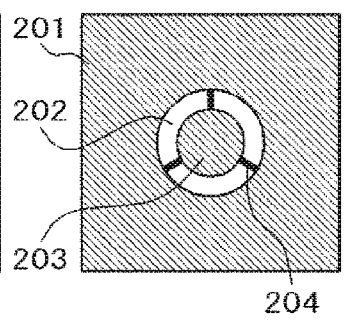
Figure 2D:
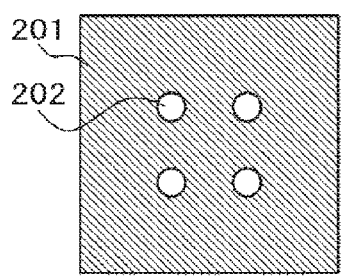
Figure 2E:
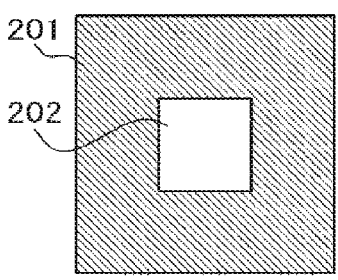
Figure 2F:
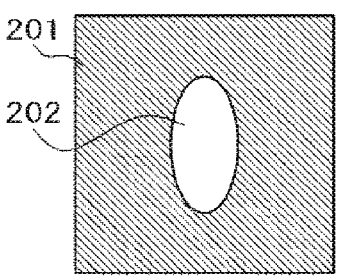
Figure 2G:
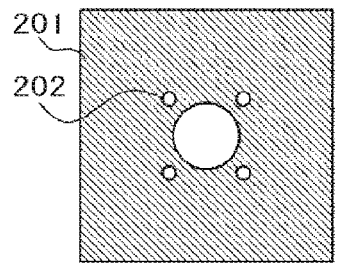
Figure 2H:
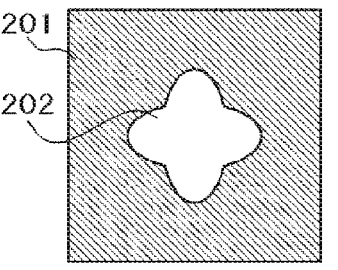

FIGS. 2B to 2H show examples of the aperture shape of the off-axis illumination aperture 103. Note that FIG. 2A shows a conventionally used circular aperture. FIGS. 2B and 2C show an annular aperture shape; FIG. 2D, a quadrupole aperture shape; FIG. 2E, a square aperture shape; FIG. 2F, an elliptical aperture shape; FIGS. 2G and 2H, more complicated aperture shapes. In any case, when the electron beam 102 arrives at the off-axis illumination aperture 103, the electron beam arrived at a mask area 201 is masked, and only the electron beam arrived at an opening area 202 passes through the off-axis illumination aperture 103. The circular aperture in FIG. 2A has an aperture shape rotation symmetric with respect to the center. It is used for formation of a beam profile without directional dependence. The annular aperture shown in FIGS. 2B and 2C has a central mask 203. The center of the electron beam is masked, and only the outside electron beam is selected. To provide the central mask 203 in a hollow part, a central-mask support 204 connects the mask area 201 to the central mask 203. FIG. 2B shows the aperture with four central-mask supports 204, and FIG. 2C, the aperture with three central-mask support 204. Note that the size of the central mask 203 shown in FIG. 2B or 2C and the size and the number of the central-mask support 204 are merely examples. Various modifications may be made, and the formed beam profile change in accordance with the shape. The quadrupole aperture shown in FIG. 2D selects only the outside electron beam as in the case of the annular aperture in FIGS. 2B and 2C. In the quadrupole aperture, in place of the central-mask support 204, four parts are set to select the electron beam. In any of the apertures shown in FIGS. 2B to 2D, the center of the electron beam is masked and only the outside electron beam is selectively used. With this configuration, it is possible to align the phase of the electron beam even when focus is shifted and to improve the depth of focus. Further, the apertures shown in FIGS. 2A to 2C are used for formation of a beam profile without directional dependence, while the apertures shown in FIGS. 2D to 2F are used for formation of a beam profile with directional dependence. In FIGS. 2D and 2E, as the beam profile shape is nearly square, the apertures shown in FIGS. 2D and 2E are used when the shape of the sample pattern is square such as a semiconductor device. In FIG. 2F, as the size of the diffraction aberration changes in horizontal and vertical directions, the aperture in FIG. 2F is used in observation of a sample having a linear shape such as a line and space. Further, the aperture may have more complicated shape such as apertures shown in FIGS. 2G and 2H. Note that the expression 1 shows only the influence of diffraction aberration, however, considering aberration caused from various optical devices constructing the electron beam observation device, it is possible to calculate a beam profile in consideration of the influence of aberration.

Figure 3:
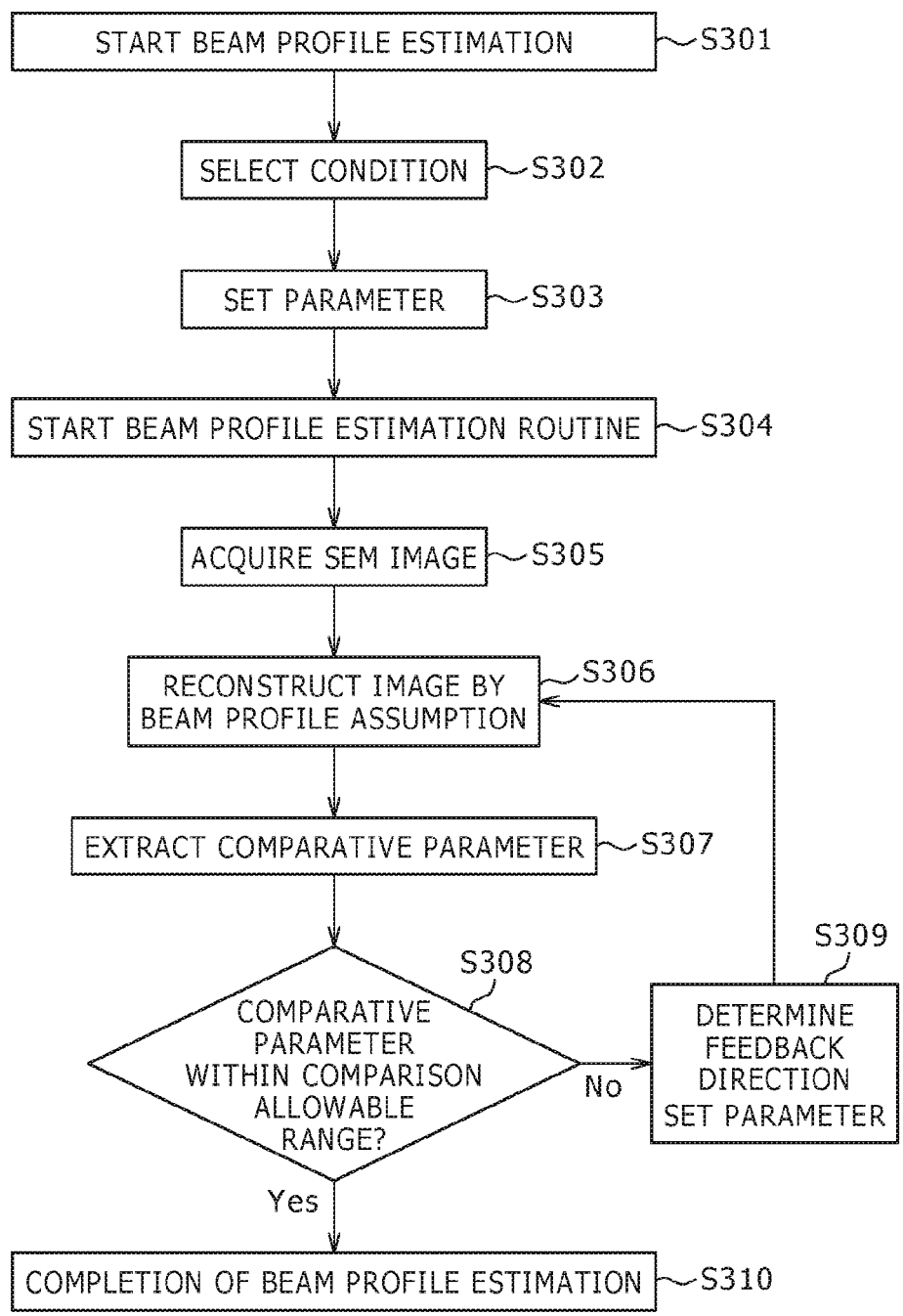
FIG. 3 is a flowchart showing the flow of beam profile estimation in the charged particle beam device according to the first embodiment.
Figure 4:
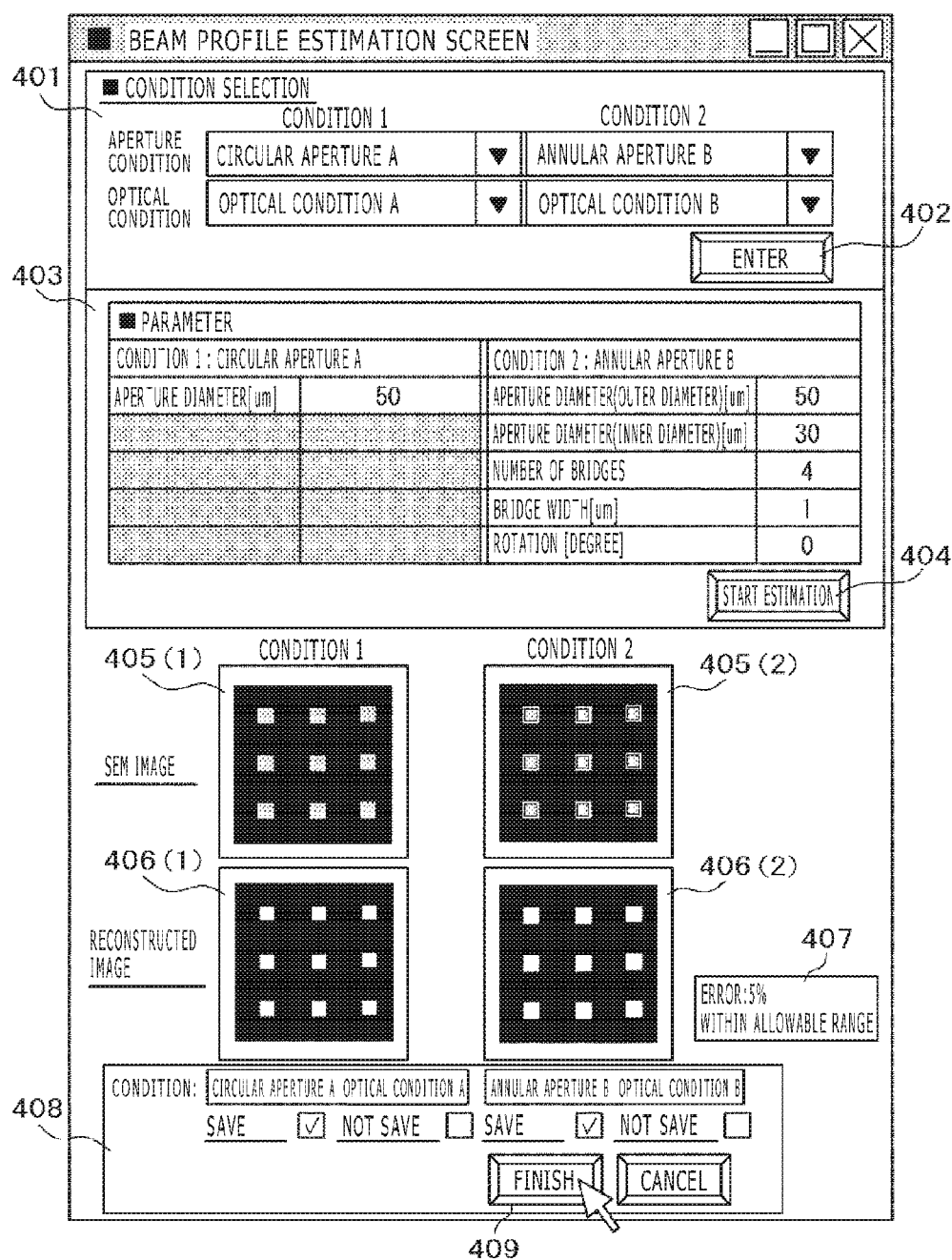
FIG. 4 is an example of a beam profile estimation screen on a display device of the charged particle beam device according to the first embodiment.

In this manner, it is possible to obtain a desired beam profile in accordance with the aperture shape of the off-axis illumination aperture 103. Since the spread of the beam profile is very small in nanometer order, it is impossible to actually check or measure the shape. Accordingly, in the present embodiment, the beam profile is estimated by using the following two types of conditions. The procedure of beam profile estimation will be described using FIGS. 3 and 4. FIG. 3 is a flowchart for beam profile estimation. The operator starts the beam profile estimation via the I/O unit 113 with a display device (S301 in FIG. 3). A beam profile estimation screen as shown in FIG. 4 appears on the display device. Hereinbelow, FIG. 4 will be referred to unless otherwise specified. The operator selects the two conditions, a condition 1 and a condition 2 at a condition selection unit 401, and presses an enter button 402 (S302). In the present embodiment, the two conditions are a combination of the type of off-axis illumination aperture 103 and various optical conditions. In the present embodiment, the aperture condition and the optical condition are respectively directly selected. However, it may be configured such that combinations of these conditions are previously stored in the memory unit 111, and are selected from a pull-down list. Regarding the selection of the off-axis illumination aperture 103, in FIG. 4, "circular aperture" is selected as the condition 1, and "annular aperture" is selected as the condition 2. Further, the optical conditions are lens focus conditions, beam current, spread angle, accelerating voltage, and results of optical axis adjustment of an electron beam. The results of previous adjustment and setting are stored in the memory unit 111. When a condition is selected, a control signal is sent from the system controller unit 110 via the controller 109 to the electron beam observation device. Then desired aperture condition and optical condition are set. At the same time, in accordance with type of the off-axis illumination aperture 103, parameters of the aperture shape such as size of aperture, previously set and stored in the memory unit 111, are displayed on a parameter display unit 403. The operator changes/corrects and inputs the parameters of the off-axis illumination aperture 103 with respect to the parameter display unit 403 in accordance with necessity (S303). When the input of the respective parameters has been completed, the operator presses an estimation start button 404, to start the beam profile estimation routine (S304). Note that the beam profile estimation routine is executed with the beam-computing-process unit 120. In the beam profile estimation routine, an SEM image is respectively acquired (405(1) and 405(2)) on the condition 1 and the condition 2 set at these steps (S305).

Next, a beam profile on the conditions set at these steps is assumed by computation with the beam-computing-process unit 120 in the computer 112. Then sharpening process is performed with the image-sharpening-process unit 121 in the computer 112 based on the beam profile and the SEM images 405(1) and 405(2). The images are reconstructed as images 406(1) and 406(2) (S306). In the reconstructed images 406(1) and 406(2), the influence of the estimated beam profile is eliminated. Accordingly, when the estimated beam profile at S306 corresponds with an actual beam profile, all the information on the off-axis illumination aperture 103 is eliminated and only the conditions of the sample 108 remain the reconstructed images 406(1) and 406(2), and the both images are the same. Accordingly, the comparison-computing-process unit 122 in the computer 112 extracts comparative parameters from the reconstructed images 406(1) and 406(2) (S307), and compares them with a threshold value (S308). When a parameter value exceeds a threshold value, the computer 112 feeds back the parameter of the off-axis illumination aperture 103 on the parameter display unit 403 so as to reduce the threshold value with reference to a previous value (S309). Then the process returns to the image reconstruction SEM image acquisition step by beam profile estimation (S306). When the parameter value becomes equal to or less than the threshold value at S308, the result is displayed on a result display unit 407. The operator makes selection as to whether or not the condition 1 and the condition 2 are to be stored, and inputs a file name, in a storage condition setting box 408, in accordance with necessity. With depression of a finish button 409, the beam profile estimation is completed (S310).

Note that although the sample is not particularly described in the beam profile estimation flow, a sample for beam profile estimation may always be provided in the electron beam observation device. Further, the position for observation on the two conditions may be the same coordinates or different coordinates where the same pattern is provided.

In the beam profile estimation flow according to the present embodiment, the method of extracting the parameters for comparison between the reconstructed image 406(1) and 406(2) is not specified. For example, when a difference image between the two images is formed, the entire difference image is darkened in accordance with similarity between the two images. In this case, the peak value and the image contrast may be used as comparative parameters. Otherwise, when cross-correlation between the two images is obtained, the correlation becomes higher and the beak value becomes greater in accordance with similarity between the two images. In this case, a reciprocal of the peak value, or a value obtained by multiplying the peak value with −1 may be used as a comparative parameter. Further, any value may be adopted as a comparative parameter as long as it is used for evaluation of similarity between the two images. Note that in the present embodiment, in image acquisition on the two conditions, the both images are simultaneously acquired. It may be configured such that when observation is performed with the same sample and in the same field of view, one of the two conditions is previously stored in the memory unit 111.

Next, the method for image sharpening based on an estimated beam profile will be described. Note that the image sharpening process is performed with the sharpening process unit. In the beam profile estimation flow, similar sharpening process is performed on the SEM images 405(1) and 405(2) and the reconstructed images 406(1) and 406(2) are obtained. In the present embodiment, deconvolution process is performed as the sharpening method. The SEM image is represented as the convolution of sample information and a beam profile, and is expressed as integration between sample information and beam profile, using Fourier transformation characteristic.

[Expression 2]

$$I = FT^{-1}(FT(S)FT(P)) \qquad (2)$$

Note that I is an SEM image; S, sample information without beam profile information; P, a beam profile; FT, Fourier transformation; and $FT^{-1}$, inverse Fourier transformation. Accordingly, the reconstructed image, i.e., sample information without beam profile information is obtained by deconvolution of beam profile from the both sides of the expression 2. The processing is performed by dividing Fourier-transformed SEM image S and the beam profile P and performing inverse Fourier transformation on the division result.

[Expression 3]

$$S = FT^{-1}\left(\frac{FT(I)}{FT(P)}\right) \quad (3)$$

With this deconvolution, it is possible to sharpen the acquired SEM image. Further, in the beam profile estimation, the reconstructed image 406(1) or 406(2) is acquired. With the above configuration, it is possible to sharpen the acquired SEM image by estimating a beam profile and using the estimated beam profile.

Figure 5:
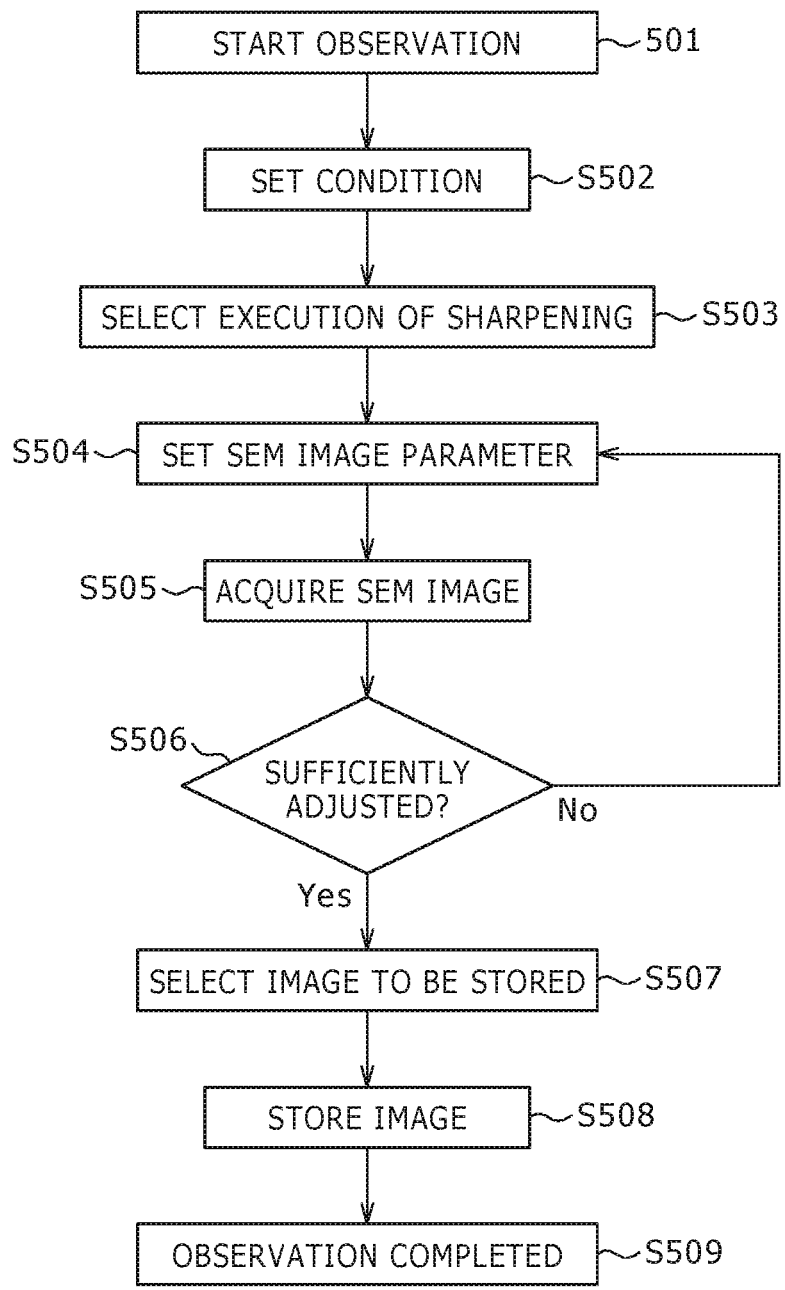
FIG. 5 is a flowchart showing the flow of sample observation in the charged particle beam device according to the first embodiment.
Figure 6:
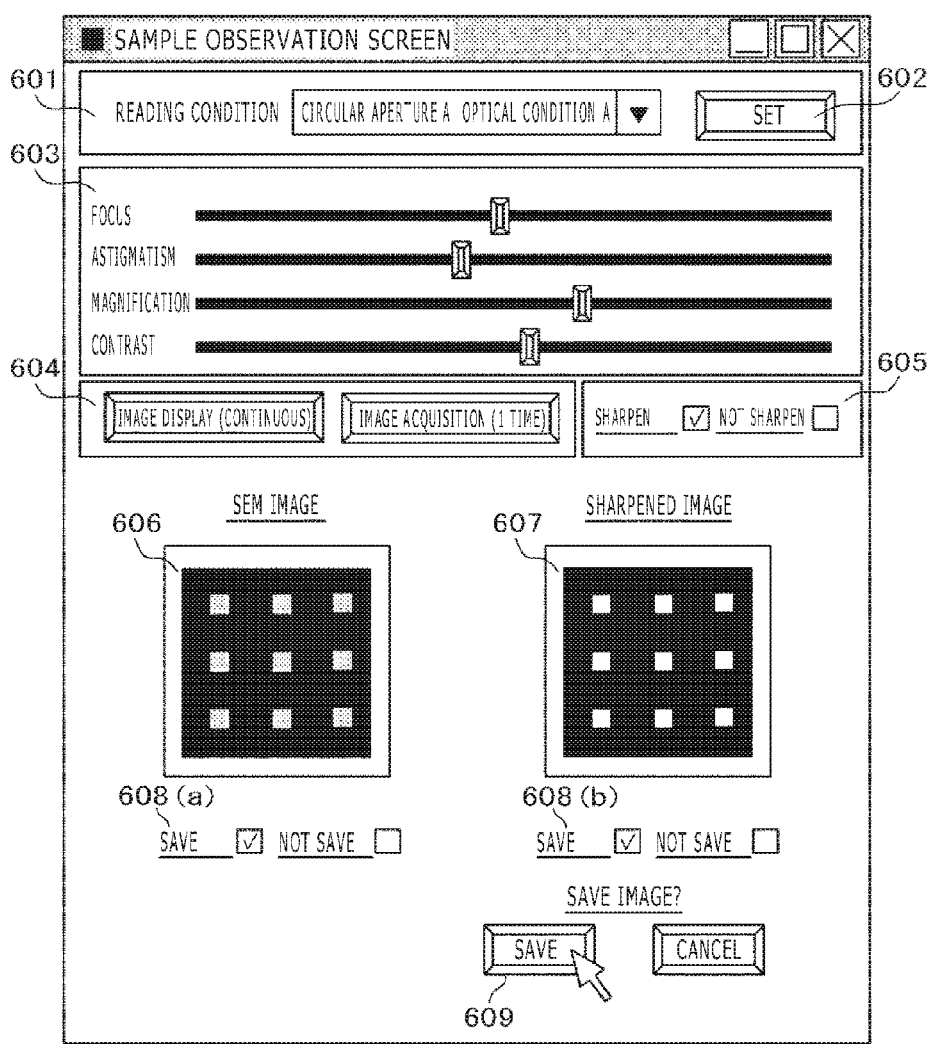
FIG. 6 is an example of a sample observation screen on the display device of the charged particle beam device according to the first embodiment.

Next, the procedure of sample observation in the present embodiment will be described using FIGS. 5 and 6. FIG. 5 is a flowchart for sample observation. The operator starts sample observation via the I/O unit 113 with a display device (S501 in FIG. 5). A sample observation screen as shown in FIG. 6 appears on the display device. Hereinbelow, FIG. 6 will be referred unless otherwise specified. The operator selects a condition file, previously determined and stored in the memory unit 111, from a read condition setting unit 601, and sets desired aperture condition and optical condition by pressing a setting button 602 (S502). The read conditions are those stored in the beam profile estimation flow described above. When the conditions are selected, a control signal is sent from the system controller unit 110 via the controller 109 to the electron beam observation device. Then desired aperture and optical conditions are set. When the various conditions have been set, the image control panel 603, the image acquisition button group 604, and the sharpening selection checkbox 605 become active. The operator makes selection as to whether or not sharpening is to be performed with the sharpening selection checkbox 605 (S503). Further, the operator sets various parameters for determining SEM image conditions such as focus, astigmatism, magnification, and contrast, shown in the image control panel 603, in accordance with necessity (S504). When the operator presses one of the image acquisition button group 604, an image is displayed in the region of an SEM image 606 or in both regions of the SEM image 606 and a sharpened image 607 (S505). Note that when execution of the sharpening is selected, the sharpening is performed by the above-described image sharpening process. The operator determines whether or not image adjustment is sufficient, and repeats the parameter setting step S504 and the SEM image acquisition step S505, in accordance with necessity, thus performs fine adjustment (S506). This step may be omitted. Further, in the present embodiment, the sharpening selection step S503 is first performed and then the parameter setting step S504 and the SEM image acquisition step S505 are performed. However, the order of these steps is not fixed. The operator makes selection as to whether or not the SEM image and the sharpened image are respectively to be stored, from checkboxes 608 (a) and 608 (b) (S507). Then the operator presses an image storage (save) button 609 to store the SEM image or the sharpened image (S508). Then the image acquisition flow is completed (S509). In the present embodiment, the beam profile estimation described in FIGS. 3 and 4 and the sample observation described in FIGS. 5 and 6 are separately performed. Accordingly, by previously estimating a beam profile, it is not necessary to perform estimation of beam profile again upon sample observation and it is possible to perform real-time image sharpening by reading the beam profile stored in the memory unit 111 and performing sharpening processing.

Figure 7:
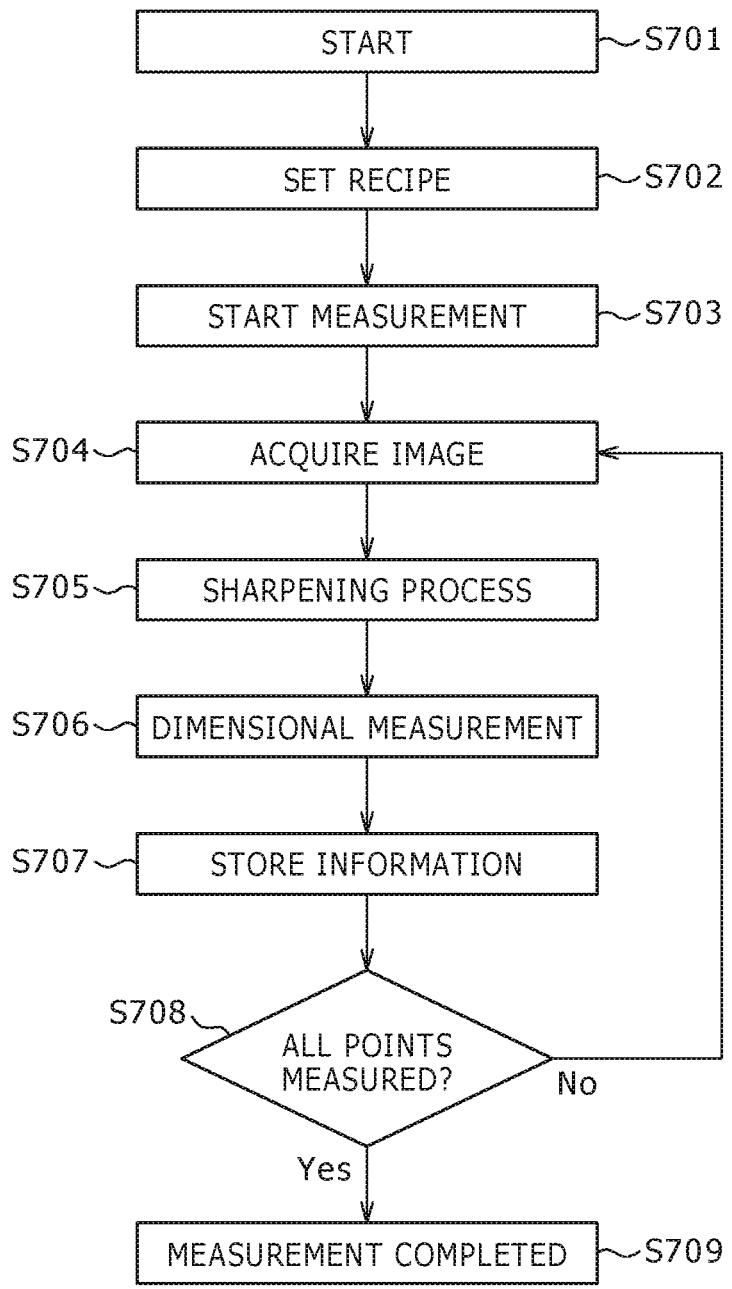
FIG. 7 is a flowchart showing a size measurement procedure in the charged particle beam device according to the first embodiment.

Next, in an example where the configuration of the present embodiment is applied to a CD-SEM (Critical Dimension-Scanning Electron Microscope) for measurement of dimension of a semiconductor device based on the acquired SEM image, a procedure of dimension measurement will be described using the flowchart of FIG. 7. The operator opens a screen for measurement (not shown) through the I/O unit 113, to start the procedure (S701). The operator sets a recipe indicating all the conditions necessary for the measurement such as the arrangement of chips in a sample to be measured, the coordinates in the chip, approximate size, material, and the number of chips regarding a device to be measured, and registers the recipe (S702). In correspondence with the recipe, the system controller unit 110 selects appropriate conditions from the aperture conditions and optical conditions previously registered in the memory unit 111. Then the measurement is started (S703). The system controller unit 110 acquires an SEM image in the coordinates corresponding to the recipe (S704), and sharpens the image by the above-described sharpening process (S705). Then the operator selects a region of the obtained sharpened image to be measured and measures the size (S706), and stores necessary information from the obtained SEM image, the sharpened image, and the size, into the memory unit 111 (S707). The system controller unit 110 determines whether or not all the points shown in the recipe have been measured, and repeatedly performs steps S704 to S707 until all the points have been measured (S708). When all the points have been measured, the measurement is completed (S709). Note that upon measurement, as the beam profile stored in the memory unit 111 is read and sharpening process is performed, it is possible to perform real-time image sharpening without degrading the throughput. Further, in the present embodiment, the series of flow of the image acquisition, sharpening, and dimensional measurement is performed as real-time processing. Further, it may be configured such that the image acquisition is performed first, then the other processes are performed later, as a flow including off-line operation.

According to the present embodiment, it is possible to provide a charged particle beam device with improved depth of focus and maintained and improved resolution by beam profile estimation upon use of off-axis illumination aperture, and further performing image sharpening. With this configuration, it is possible to perform high resolution observation even with respect to a sample having a highly uneven surface. Further, it is possible to perform high accuracy dimensional measurement.

Note that in the present embodiment, all the settings of the optical system such as optical axis adjustment are performed separately, and settings are not shown in the operator's direct setting. However, these settings may be performed by the operator prior to the beam profile estimation or the sample observation. Otherwise, the settings may be automatically performed and determined by feedback to the control system based on the sharpness measured from the image. Note that it goes without saying that the beam profile estimation screen an example of which is shown in FIG. 4 and the sample observation screen shown in FIG. 6 are not limited to these examples but various modifications may be made.

Second Embodiment

A second embodiment of the present invention will be described. Note that the elements described in the first embodiment but not described in the present embodiment are applicable to the present embodiment unless there are special circumstances.

In the first embodiment, the example using deconvolution in the expression 3 as a method of image sharpening has been described. In the present embodiment, an example where deconvolution is not used but a beam profile is converted into an arbitrary sharp beam profile will be described. Since the configuration of the electron beam observation device, the beam profile estimation, the sample observation, and the dimensional measurement procedure are the same as those according to the first embodiment, the explanations of these operations will be omitted, and only the image sharpening method will be described in the present embodiment. Assuming that a sharp beam profile is Ps, and a sharpened image is Is, the sharpened image Is in the present embodiment is obtained by convolution between the sharp beam profile Ps and sample information S. Accordingly, it is obtained by the following processing utilizing the expression 3.

[Expression 4]

$$Is = FT^{-1}(FT(S)FT(Ps)) \quad (4)$$
$$= FT^{-1}\left(FT(I)\frac{FT(Ps)}{FT(P)}\right)$$

Note that I is an acquired SEM image; P, a beam profile of the acquired image (estimated beam profile) previously estimated by the method described in the first embodiment. The sharpened image Is includes information on the sharp beam profile Ps, but it has sufficiently high resolution, accordingly it is a sharpened image. As a sharp beam profile Ps, the operator may determine an optimum shape, e.g., a beam profile with a circular aperture on an optical condition to obtain the highest resolution with the electron beam observation device in the present embodiment, or a beam profile with Gaussian distribution having dispersion equal to or less than a desired resolution. Otherwise, it may be configured so as to prevent blur of SEM image, such that the beam profile has a width approximately equivalent width of pixel size, i.e. a full width half maximum of the beam profile is 1 to 5 times the pixel size. Accordingly, it is possible to perform image sharpening by the expression 4 with the acquired SEM image I, the estimated beam profile P, and the arbitrary sharp beam profile Ps as parameters. This method is particularly advantageous as a method for sharpening without noise expansion when the SEM image is noisy and the noise of the image is conspicuous (S/N is equal to or less than 30).

In the present embodiment, it is also possible to provide a charged particle beam device with improved depth of focus and maintained and improved resolution by estimating a beam profile upon use of an off-axis illumination aperture and further by sharpening the image. With this configuration, it is possible to perform high resolution observation even with respect to a sample having a highly uneven surface. Further, it is possible to perform high accuracy dimensional measurement. Note that in the present embodiment, all the settings of the optical system such as optical axis adjustment are performed separately, and these settings are not shown in the operator's direct setting. However, as in the case of the first embodiment, these settings may be performed by the operator prior to the beam profile estimation or the sample observation. Otherwise, the settings may be automatically performed and determined by feedback to the control system based on the sharpness measured from the image.

Third Embodiment

Figure 8:
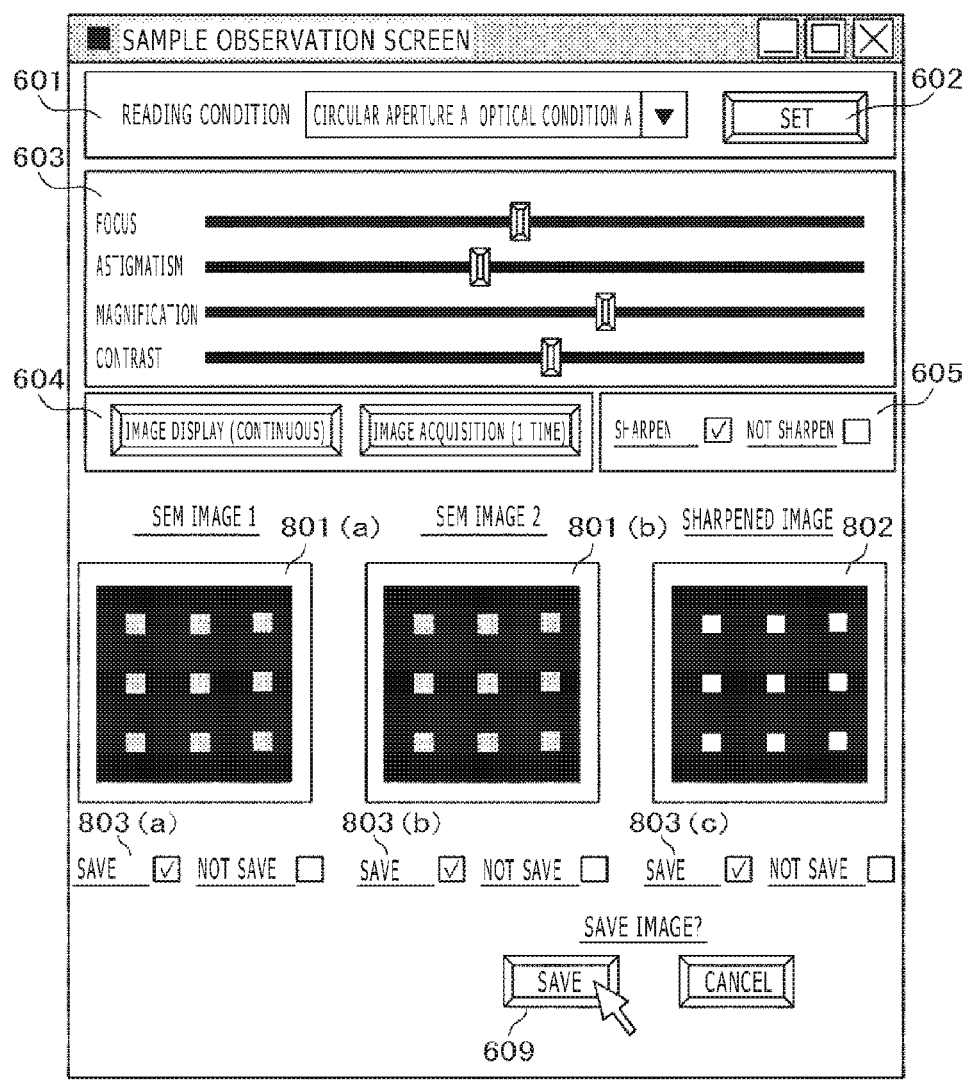
FIG. 8 is an example of the sample observation screen on the display device of the charged particle beam device according to a third embodiment.

A third embodiment of the present invention will be described using FIGS. 8 to 10. Note that the elements described in the first or second embodiment but not described in the present embodiment are applicable to the present embodiment unless there are special circumstances.

In the first embodiment, the example using the deconvolution in the expression 3 as a method of image sharpening has been described. In the second embodiment, the example of conversion of the beam profile into a sharp beam profile has been described. In the present embodiment, a method of acquiring two types of images and combine the information will be described. Since the configuration of the electron beam observation device and the beam profile estimation procedure are the same as those according to the first embodiment, the explanations of these operations will be omitted.

The sample sharpening method and sample observation method according to the present embodiment will be described using FIG. 8. FIG. 8 shows a sample observation screen on the display device of the charged particle beam device according to the present embodiment. The difference from the sample observation screen shown in FIG. 6 is that two SEM images 801(a) and 801(b) are acquired. A sample observation procedure will be described using the sample observation flow of FIG. 5. As in the case of the first embodiment, the operator starts sample observation via the I/O unit 113 having a display device (S501), then the sample observation screen shown in FIG. 8 appears. A desired aperture condition and a desired optical condition are set (S502) by selecting a condition file previously determined from the read condition setting unit 601 and stored in the memory unit 111 and pressing a setting button 602. Unlike the first embodiment, as the read condition, two conditions stored in the above-described beam profile estimation flow are selected. When the conditions are selected, a control signal is sent from the system controller unit 110 via the controller 109 to the electron beam observation device main body. Thus desired aperture and optical condition are set. When the various conditions have been set, the image control panel 603, the image acquisition button group 604, and the sharpening selection checkbox 605 become active. The operator makes selection as to whether or not sharpening is to be performed with the sharpening selection checkbox 605 (S503). At the present step, when non-execution of sharpening is selected, since it is the same as the selection of non-execution of sharpening in the first embodiment, selection of execution of sharpening will be described here. The operator sets the various parameters in accordance with necessity (S504). When the operator presses any one of the image acquisition button group 604, an image is displayed on SEM images 801(a) and 801(b) or/and a sharpened image 802 (S505). The operator determines whether or not image adjustment is sufficient. When the operator determines that the image adjustment is insufficient, the operator repeats the parameter setting step S504 and the SEM image acquisition step S505, thus performs fine adjustment (S506). When the operator determines that the image adjustment is sufficient, this step may be omitted. Further, in the present embodiment, the sharpening selection step S503 is first performed, then the parameter setting step S504 and the SEM image acquisition step S505 are performed. However, the order of these steps is not fixed. The operator makes selection from checkboxes 803(*a*), 803(*b*), and 803(*c*) as to whether or not the SEM image and the sharpened image are respectively to be stored (S507). Then the operator presses the image storage (save) button 609 to store the SEM image or the sharpened image (S508). Then the image acquisition flow is completed (S509). In the present embodiment, the beam profile estimation and the sample observation described in FIGS. 3 and 4 are separately performed. Accordingly, by previously estimating a beam profile, it is not necessary to perform beam profile estimation again upon sample observation, and it is possible to perform real-time image sharpening by reading the beam profile stored in the memory unit 111 and performing sharpening processing.

Figure 9A:
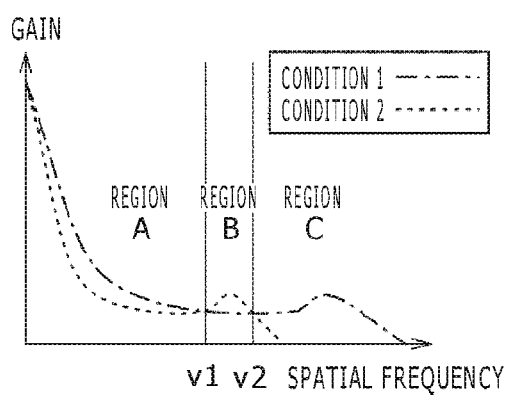
FIG. 9A shows an optical transfer function on two types of conditions in the charged particle beam device according to the third embodiment.
Figure 9B:
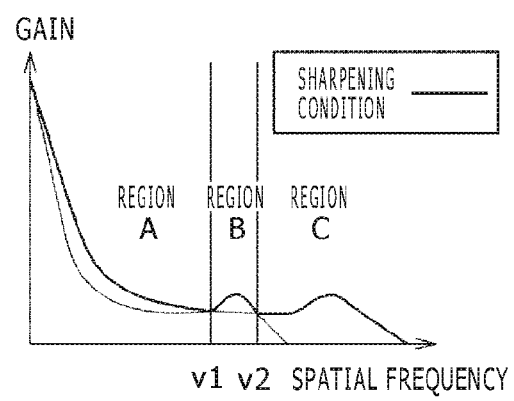
FIG. 9B shows an optical transfer function after sharpening process in the charged particle beam device according to the third embodiment.

Next, the image sharpening method according to the present embodiment will be described using FIGS. 9A, 9B and 10. As described above, in the present embodiment, two SEM images at the same place are acquired using two types of conditions. Note that as the conditions, any of the magnification of the optical system in the charged particle beam device, rotation of the off-axis illumination aperture in a direction parallel to the sample, and the aperture shape of the off-axis illumination is changed. FIGS. 9A and 9B show Fourier transformation and conversion of a beam profile on the two conditions into information in a spatial frequency region. This is referred to as an optical transfer function which indicates information transfer performance in each spatial frequency, i.e., gain. As the gain is higher, it is possible to transfer more information. Note that in FIGS. 9A and 9B, the spatial frequency is linearly represented for the sake of simplicity. Actually, as the coordinates of the SEM image are two-dimensional coordinates, two-dimensional spatial frequency axes are used for the optical transfer function. In the example shown in FIG. 9A, there are two intersectional points between the optical transfer functions on the condition 1 and the condition 2. The spatial frequencies at this time are referred to as v1 and v2. In a frequency region lower than the point v1 (region A), the gain on the condition 1 is higher; in a region from the intersection v1 to the point v2 (region B), the gain on the condition 2 is higher; and in a region higher than the point v2 (region C), the gain on the condition 1 is higher again. Accordingly, FIG. 9B shows as the sharpening condition, in the regions A and C, the optical transfer function on the condition 1 is selected, and in the region B, the optical transfer function on the condition 2 is selected. On this condition, an SEM image more sharpened than the SEM images on the condition 1 and the condition 2 is acquired. As the conditions 1 and 2, conditions where the opening angle on the sample and the magnification of the entire optical system are changed, and a condition where the aperture type is changed, may be used. Further, as shown in FIGS. 2D to 2H, when the aperture shape is not rotation symmetric but it has anisotropy, as the optical transfer function also has anisotropy, the directional difference may be adopted.

Next, FIG. 10 shows a sharpening flow after the acquisition of the SEM images on the condition 1 and the condition 2. First, when the sharpening is started (S1001), the computer 112 calculates the optical transfer functions on the condition 1 and the condition 2 and obtains intersections. Then the computer 112 segments the region with the spatial frequency between the intersections as a border. Further, the computer 112 sets the region as a region where the gain of the optical transfer function is higher (S1002). Next, the computer 112 acquires Fourier transformed images of the SEM images 1 and 2 (S1003), and segments the two Fourier transformed images in the region set at S1002 (S1004). The computer 112 selects one of the Fourier transformed images on the condition 1 and the condition 2 segmented at S1004 as an image where the gain is higher at S1002. Further, a sharpened Fourier transformed image is acquired by connecting the Fourier transformations in the respective regions (S1005). The computer 112 performs inverse Fourier transform processing on the sharp Fourier transformed image, to acquire a sharpened image (S1006). Then the series of sharpening process is completed (S1007).

In the present embodiment, it is also possible to provide a charged particle beam device with improved depth of focus and maintained/improved resolution by estimating a beam profile upon use of off-axis illumination aperture and further performing image sharpening. With this configuration, it is possible to high resolution observation even with respect to a sample having a highly uneven surface. Further, it is possible to perform high accuracy dimensional measurement. Note that in the present embodiment, all the settings of the optical system such as optical axis adjustment are performed separately, and these settings are not shown in the operator's direct setting. However, as in the case of the first embodiment and the second embodiment, these settings may be performed by the operator prior to the beam profile estimation or the sample observation. Otherwise, the settings may be automatically performed and determined by feedback to the control system based on the sharpness measured from the image.

Fourth Embodiment

A fourth embodiment of the present invention will be described. Note that the elements described in the first to third embodiments but not described in the present embodiment are applicable to the present embodiment unless there are special circumstances.

In the first to third embodiments, one off-axis illumination aperture 103 is provided. In an actual charged particle beam device, a general condition is use of a circular aperture. It is desirable that the off-axis illumination aperture is used only when it is necessary to use it. Accordingly, in the present embodiment, a circular aperture is provided in addition to the off-axis illumination aperture 103 in the configuration of FIG. 1. An example where the circular aperture is used under normal conditions, and the off-axis illumination aperture is used in accordance with necessity will be described. Since the beam profile estimation, the sample observation, the dimensional measurement procedure, and the image sharpening process are the same as those according to the first to third embodiments, the explanations of these operations will be omitted in the present embodiment.

FIGS. 11A to 11F respectively show a schematic configuration of the electron beam observation device according to the present embodiment. Note that in the present embodiment, only parts constructing the optical system are shown. The other parts are the same as those in the first to third embodiments. For example, the respective elements are connected to the controller 109. Further, the controller 109 is connected to the system controller unit 110. The system controller 110, functionally provided with the memory unit 111 and the computer 112, is connected to the I/O unit 113 having the display device. The stage and the like are omitted. In FIGS. 11A to 11F, the difference from FIG. 1 is that the electron beam observation device is provided with the circular aperture 1101. The off-axis illumination aperture 103 is mounted in a movable mechanism, and is withdrawn to a position not irradiated with the electron beam 102. FIG. 11B shows a state where the off-axis illumination aperture 103 is withdrawn, only the circular aperture 1101 is irradiated with the electron beam 102, the electron beam 102 is selected and passed through the circular aperture 1101. It may be configured such that the circular aperture 1101 is mounted in the movable mechanism, and the electron beam 102 is withdrawable to a not-irradiated position. FIG. 11C shows a state where the circular aperture 1101 is withdrawn, only the off-axis illumination aperture 103 is irradiated with the electron beam 102, and the electron beam 102 is selected and passed through the off-axis illumination aperture 103.

As shown in FIG. 11A, it may be configured such that the circular aperture 1101 and the off-axis illumination aperture 103 are not withdrawn but are used. In a case where the electron beam 102 is selected with both of the circular aperture 1101 and the off-axis illumination aperture 103, the advantages of the improvement in the depth of focus and the maintenance/improvement in the resolution are not lost. In the present embodiment, particularly shown is an example where an electron beam 1102 selected with a circular aperture 1101 has a sufficient spread, and an electron beam 1103 is selected from the electron beam 102 only with the off-axis illumination aperture 103. An example where the circular aperture 1101 is not withdrawn and the electron beam 102 is finally selected only with the off-axis illumination aperture 103 will be described using FIGS. 11D to 11F. FIG. 11D is an enlarged view of the electron beam 102 in the vicinity of the circular aperture 1101 and the off-axis illumination aperture 103 in FIG. 11A. Using this figure, the example where the electron beam 102 is selected only with the off-axis illumination aperture 103 will be described. It is assumed that the radius of the circular aperture is Rc, the distance from an optical axis 115 in a point passing the outmost side in the opening of the off-axis illumination aperture, Ro, and the distance between the apertures is L. It is necessary that radius Rc of the circular aperture 1101 is equal to or greater than a minimum radius $Rc_{min}$ geometrically represented in the following expression, when the electron beam 1102 passed through the circular aperture 1101 spreads more sufficiently than the off-axis illumination aperture 103 and selected as the electron beam 1103 with the off-axis illumination aperture 103.

[Expression 5]

$$Rc \geq Rc_{min} = Ro + \frac{L}{\tan\theta} \quad (5)$$

Note that θ is an angle from the electron beam 1103 selected with the off-axis illumination aperture 103 shown in FIG. 11D with respect to the off-axis illumination aperture 103. As shown in the expression 5, when the opening sizes of the circular aperture and the off-axis illumination aperture are defined, it is possible to select the circular aperture and the off-axis illumination aperture, without withdrawing the circular aperture 1101, only with the off-axis illumination aperture mounted in the movable mechanism. Note that in FIG. 11D, the circular aperture 1101 is provided upstream of the off-axis illumination aperture 103. In a case where the circular aperture 1101 is provided on the downstream side, the negative/positive sign of L in the expression 5 is inverted, and the expression is describable. Further, in FIG. 11D, the angle θ is an acute angle. However, the angle θ may be an obtuse angle.

The expression 5 is established when a cross over 1104 is formed between the circular aperture 1101 and the off-axis illumination aperture 103. FIG. 11E shows an enlarged view of the electron beam 102 in the vicinity of the circular aperture 1101 and the off-axis illumination aperture 103 in FIG. 11A for explaining selection of the electron beam 102 only with the off-axis illumination aperture 103 in this case. It is geometrically apparent from FIG. 11E that any one positive/negative sign of Ro or Rc and $Rc_{min}$ is inverted in the expression 5.

Further, it may be configured such that one or more lenses are provided between the circular aperture 1101 and the off-axis illumination aperture 103. FIG. 11F shows this case. In this case, the expression becomes complicated when the angle θ and the inter-aperture distance L are taken into consideration as shown in FIGS. 11D and 11E. Accordingly, the conditions are determined assuming that the magnification of a lens 1105 is M; the minimum opening radius of the circular aperture, $Rc_{min}$; the object surface opening angle, α; the distance from the surface object to the lens 1105, a; the distance from the optical axis 115 in a point passing through the outermost side in the opening of the off-axis illumination aperture, Ro. It is found from FIG. 11F that the distance Lc between the circular aperture 1101 and the lens 1105, and the distance between the lens 1105 and the off-axis illumination aperture 103 are geometrically determined with the following expression. Further, it is necessary that the aperture radius Rc of the circular aperture is equal to or greater than $Rc_{min}$.

[Expression 6]

$$Lc = a - \frac{Rc_{min}}{\tan\alpha}, \ Lo = Ma - \frac{Ro}{\tan\left(\frac{\alpha}{M}\right)}, \ Rc \geq Rc_{min} \quad (6)$$

As shown in the expression 6, when the opening sizes of the circular aperture and the off-axis illumination aperture are defined, it is possible to select the circular aperture and the off-axis illumination aperture, without withdrawing the circular aperture 1101, only with the off-axis illumination aperture in the movable mechanism. Note that in the present embodiment, the circular aperture 1101 is provided upstream of the off-axis illumination aperture 103. However, the expression is describable when the circular aperture 1101 is provided on the downstream side. Further, in the present embodiment, the description has been made on the condition that the lens 1105 has an object point and forms an image. However, even on the condition that the lens 1105 has no object point or the lens power is low to form an image, it is possible to obtain the conditional expression as in the case of the expression 6 by defining a virtual object surface and virtual image surface.

Note that in the present embodiment, when the minimum aperture radius $Rc_{min}$ is selected as a radius of the circular aperture, the diameter of the circular aperture 1101 and the distance from the optical axis 115 in the point passing through the outermost side in the opening of the off-axis illumination aperture correspond with each other. Accordingly, it is possible to determine this condition as a condition of the same opening angle.

Further, in the present embodiment, when the circular aperture 1101 is selected and when one of the circular aperture 1101 and the off-axis illumination aperture 103 is selected, the description has been made on the presumption that the power of the optical device such as a lens is not changed. However, it is possible to form a different optical condition by changing the power of the optical device.

In the present embodiment, by estimating a beam profile upon use of the off-axis illumination aperture and further performing image sharpening, it is possible to provide a charged particle beam device with improved the depth of focus and maintained and improved resolution. With this configuration, it is possible to perform high resolution observation even on a sample having a highly uneven surface. Further, it is possible to perform high accuracy dimensional measurement. Further, when the circular aperture and the off-axis illumination aperture are provided, it is possible to select the circular aperture at normal times but use the off-axis illumination aperture in accordance with necessity.

Fifth Embodiment

A fifth embodiment of the present invention will be described. Note that the elements described in the first to fourth embodiments but not described in the present embodiment are applicable to the present embodiment unless there are special circumstances.

In the fourth embodiment, the off-axis illumination aperture 103 and the circular aperture 1101 are arrayed along the optical axis 115 in a vertical direction, as a configuration to use the circular aperture under normal conditions and use the off-axis illumination aperture in accordance with necessity. In the present embodiment, an example where the off-axis illumination aperture has plural types of apertures for the off-axis illumination aperture within the same plane, and is mounted in the movable mechanism, and the aperture is changed by selecting the aperture with the movable mechanism, will be described. Since the beam profile estimation, the sample observation, the dimensional measurement procedure, and the image sharpening method are the same as those according to the first to third embodiments, the explanations of these operations will be omitted in the present embodiment.

Figure 12:
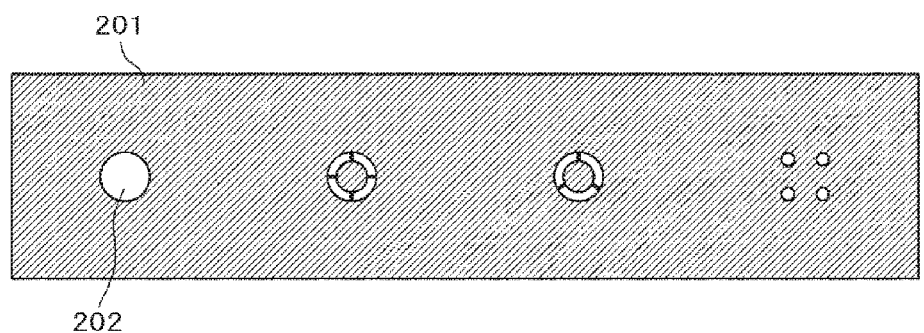
FIG. 12 is a plane diagram of the off-axis illumination aperture in the charged particle beam device according to a fifth embodiment.

The configuration of the electron beam observation device according to the present embodiment is the same as that shown in FIG. 1 except that the off-axis illumination aperture 103 is mounted in the movable mechanism, and has plural types of openings for the off-axis illumination aperture within the same plane. FIG. 12 shows the plane where the apertures of the off-axis illumination aperture 103 according to the present embodiment are provided. FIG. 12 shows an example where four apertures are provided, and the apertures are a circular aperture, an annular aperture with four center mask supports, an annular aperture with three center mask supports, and a quadrupole aperture. Note that any combination of apertures may be used. The interval between the respective apertures is sufficient with respect to the range of irradiation of the off-axis illumination aperture 103 with the electron beam 102. For example, the interval of the movable aperture mechanism used in the present embodiment is 2.5 mm. As the position is changed by 2.5 mm feed amount by moving the mechanism in accordance with the notch of the movable aperture, the aperture is changed. In this manner, by moving the movable mechanism so as to irradiate an aperture to be used with the electron beam 102, it is possible to select the off-axis illumination aperture. Note that in the present embodiment, the example where the off-axis illumination aperture is selected by manually moving the movable mechanism has been shown. It may be configured such that the device is connected to an automatic movable mechanism such as a motor and the aperture is changed with a controller.

As described above, it is possible to select the circular aperture under normal conditions and to use the off-axis illumination aperture in accordance with necessity.

In the present embodiment, it is possible to provide a charged particle beam device with improved depth of focus and maintained and improved resolution by estimating a beam profile upon use of the off-axis illumination aperture and further performing image sharpening. With this configuration, it is possible to perform high resolution observation even on a sample having a highly uneven surface, and to perform high-accuracy dimensional measurement. Further, it is possible to easily select desired off-axis illumination.

Sixth Embodiment

A sixth embodiment of the present invention will be described. Note that the elements described in the first to third and fifth embodiments but not described in the present embodiment are applicable to the present embodiment unless there are special circumstances.

In the fourth embodiment, the off-axis illumination aperture 103 and the circular aperture 1101 are arrayed along the optical axis 115 in a vertical direction, as a configuration to use the circular aperture under normal conditions and use the off-axis illumination aperture in accordance with necessity. In the fifth embodiment, the plural types of apertures for the off-axis illumination aperture within the same plane are selected with the movable mechanism. In the present embodiment, plural types of apertures are provided within the same plane of the off-axis illumination aperture 103 as in the case of the fifth embodiment. The aperture is selected by deflection of the aperture electron beam. Since the beam profile estimation, the sample observation, the dimensional measurement procedure, and the image sharpening method are the same as those according to the first to third embodiments, the explanations of these operations will be omitted in the present embodiment.

Figure 13A:
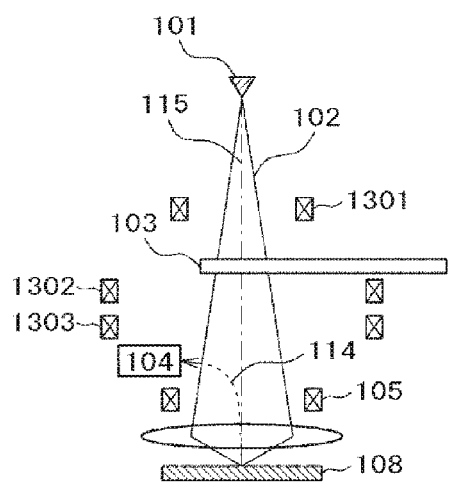
FIG. 13A is a block diagram showing a schematic configuration of the charged particle beam device (electron beam observation device) according to a sixth embodiment, where deflectors 1301 to 1303 are not operated.
Figure 13B:
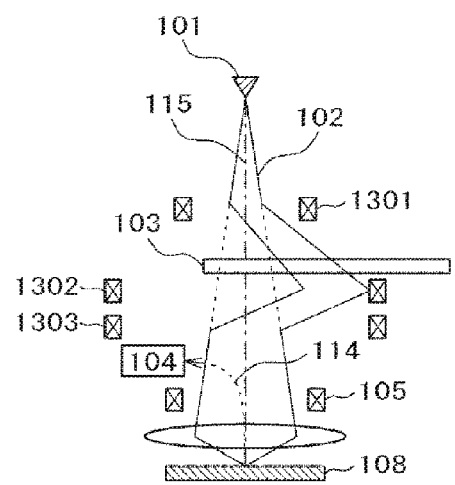
FIG. 13B is a block diagram showing a schematic configuration of the charged particle beam device (electron beam observation device) according to the sixth embodiment, where the deflectors 1301 to 1303 are operated.

FIGS. 13A and 13B respectively show a schematic configuration of the electron beam observation device according to the present embodiment. Note that in the present embodiment, only the elements constructing the optical system are shown, and the other elements are the same as those in the first to third embodiments. For example, the respective elements are connected to the controller 109. The controller 109 is connected to the system controller unit 110. The system controller unit 110 is functionally provided with the memory unit 111 and the computer 112, and is connected to the I/O unit 113 having the display device. The stage and the like are omitted. In FIGS. 13A and 13B, the difference from FIG. 1 is that three stages of deflectors 1301 to 1303 are provided. In FIG. 13A, the deflectors 1301 to 1303 are not operated, and the electron beam 102 is passed through the same trajectory as that in FIG. 1. FIG. 13B shows an example where the deflectors 1301 to 1303 are operated. The electron beam 102 is greatly deflected in a rightward direction in the drawing with the deflector 1301 provided upstream of the off-axis illumination aperture, to irradiate the off-axis illumination aperture 103. With this configuration, it is possible to select an aperture provided in a position other than positions along the optical axis on the off-axis illumination aperture 103 and pass the electron beam through the selected aperture. When the electron beam 102 has been passed through the off-axis illumination aperture 103, the electron beam 102 is still in the deflected state. To restore the initial trajectory, the deflectors 1302 and 1303 provided downstream of the aperture are used. Note that the number of deflectors provided downstream of the aperture may be one, however. In the present embodiment, to correct the change of the trajectory with the deflector 1301 and restore the initial trajectory, two stages of deflectors 1302 and 1303 are used, regardless of arrangement of the deflectors in the vertical direction. Further, in the present embodiment, the deflector 1301 as only one stage of deflector is provided upstream of the aperture, however, another stage of deflector may be added, as two stages of deflectors, to perform vertical irradiation with respect to the aperture.

As described above, it is possible to select the circular aperture under normal conditions and to use the off-axis illumination aperture in accordance with necessity.

In the present embodiment, it is possible to provide a charged particle beam device with improved depth of focus and maintained and improved resolution by estimating a beam profile upon use of the off-axis illumination aperture and further performing image sharpening. With this configuration, it is possible to perform high resolution observation on a sample having a highly uneven surface. Further, it is possible to perform high-accuracy dimensional measurement. Further, it is possible to easily select a desired aperture, without mechanical movement, by providing deflectors to deflect a primary beam and to restore an initial trajectory of the beam at one of plural types of apertures for the off-axis illumination aperture.

Note that the present invention includes the following embodiments.

(1) A sample observation system including: a charged particle source; an off-axis illumination aperture; an objective lens; a controller including a computer and a memory unit; and an input/output unit including a display unit, in which a sample is irradiated with a charged particle beam caused from the charged particle source via the off-axis illumination aperture and the objective lens, a generated signal is detected, and an image is acquired, and in which the computer has: a beam-computing-process unit to perform beam computation process to estimate a beam profile of the charged particle beam; and a sharpening process unit that performs a sharpening process to sharpen the image using the estimated beam profile.

(2) In the sample observation system in (1), the aperture shape of the off-axis illumination aperture is an annular aperture.

The present invention is advantageous as a charged particle beam device, and more particularly high-sensitivity and high-efficiency observation/inspection and measuring techniques utilizing a charged particle beam.

What is claimed is:

1. A charged particle beam apparatus comprising:
a charged particle source;
an off-axis illumination aperture;
a lens;
a computer; and
a memory,
wherein a signal, generated by irradiating a sample with a charged particle beam caused from the charged particle source via the off-axis illumination aperture and the lens, is detected, so as to acquire an image, and
wherein the computer comprises
a beam-computing-processor configured to perform a beam computation process to estimate a beam profile of the charged particle beam; and
a sharpening processor configured to perform a sharpening process to sharpen the image using the estimated beam profile, using a first image acquired on a first illumination condition, and a second image acquired on a second illumination condition, by
calculating a first optical transfer function corresponding to the first illumination condition with the sharpening process unit using the first image acquired on the first illumination condition;
calculating a Fourier image of the first image with the sharpening processor;
calculating a second optical transfer function corresponding to the second illumination condition with the sharpening processor using the second image acquired on the second illumination condition;
calculating a Fourier image of the second image with the sharpening processor; and
forming a sharpened Fourier image by selecting the first Fourier image or the second Fourier image, corresponding to the first optical transfer function or the second optical transfer function, with a higher gain, and combining the selected images,
wherein the first illumination condition or the second illumination condition is obtained by changing any of optical system magnification of the charged particle beam apparatus, rotation of the off-axis illumination aperture in a direction parallel to the sample, and the aperture shape of the off-axis illumination aperture.

2. The charged particle beam apparatus according to claim 1,
wherein the beam computation process is processing to estimate the beam profile by computation with an illumination condition determined with an optical condition including any of an aperture shape of the off-axis illumination aperture, an optical system magnification of the charged particle beam apparatus, accelerating voltage of the charged particle beam, and power of the lens, as an input value,
wherein the sharpening process is deconvolution processing of the image using the estimated beam profile, and
wherein the memory holds the estimated beam profile.

3. The charged particle beam apparatus according to claim 1, wherein the sharpening process is processing to convert the estimated beam profile into a second beam profile assumed separately from the estimated beam profile.

4. The charged particle beam apparatus according to claim 3, wherein the second beam profile is any one of a circular beam profile using a circular aperture, a Gaussian beam profile in use of a Gaussian beam, and a pixel beam profile in size one to five times a pixel size of the image.

5. The charged particle beam apparatus according to claim 1, wherein the sharpening processor is further configured to:
calculate, using the sharpening processor, a spatial frequency at a point where the first optical transfer function and the second optical transfer function intersect;
segment the optical transfer function into plural regions with the spatial frequency as a border;
form the sharpened Fourier image by selecting the first Fourier image or the second Fourier image in the plural regions; and
perform inverse Fourier transformation on the sharpened Fourier image.

6. The charged particle beam apparatus according to claim 1, further comprising:
a circular aperture separately from the off-axis illumination aperture; and a movable mechanism that withdraws the off-axis illumination aperture to a position not irradiated with the charged particle beam.

7. The charged particle beam apparatus according to claim 1,
wherein the off-axis illumination aperture has a plurality of types of off-axis illumination apertures on the same plane, and
wherein a selector that selects one of the plurality of types of apertures is further provided.

8. The charged particle beam apparatus according to claim 7, wherein the selector is a movable mechanism for the off-axis illumination aperture.

9. The charged particle beam apparatus according to claim 7, wherein the selector includes a first deflector provided upstream of the off-axis illumination aperture and a second deflector provided downstream of the off-axis illumination aperture.

10. The charged particle beam apparatus according to claim 1,
wherein the computer includes a comparison processor, and
wherein the comparison processor makes comparison between a first reconstructed image, obtained by performing the sharpening process with respect to a first input image acquired with the charged particle beam apparatus on the first illumination condition, with the first illumination condition as an input value, using the first estimated beam profile obtained with the beam-computing-processor, and a second reconstructed image, obtained by performing the sharpening process with respect to a second input image acquired with the charged particle beam application apparatus on the second illumination condition, with the second illumination condition as an input value, using the second estimated beam profile obtained with the beam-computing-processor, as to whether the input images are the same or not.

11. A charged particle beam apparatus comprising:
a charged particle source;
an off-axis illumination aperture;
an objective lens;
a controller including a computer and a memory; and
an input/output unit including a display,
wherein an image is acquired by detecting a signal, generated by irradiating a sample with a charged particle beam caused from the charged particle source via the off-axis illumination aperture and the objective lens,
wherein the computer comprises
a beam-computing-processor configured to perform a beam computation process to estimate a beam profile of the charged particle beam; and
a sharpening processor configured to perform a sharpening process to sharpen the image using the estimated beam profile,
using a first image acquired on a first illumination condition, and a second image acquired on a second illumination condition, by
calculating a first optical transfer function corresponding to the first illumination condition with the sharpening process unit using the first image acquired on the first illumination condition;
calculating a Fourier image of the first image with the sharpening processor;
calculating a second optical transfer function corresponding to the second illumination condition with the sharpening processor using the second image acquired on the second illumination condition;
calculating a Fourier image of the second image with the sharpening processor; and
forming a sharpened Fourier image by selecting the first Fourier image or the second Fourier image, corresponding to the first optical transfer function or the second optical transfer function, with a higher gain, and combining the selected images,
wherein the first illumination condition or the second illumination condition is obtained by changing any of optical system magnification of the charged particle beam apparatus, rotation of the off-axis illumination aperture in a direction parallel to the sample, and the aperture shape of the off-axis illumination aperture, and
wherein the display displays a reconstructed image of the image sharpened using the estimated beam profile.

12. The charged particle beam apparatus according to claim 11, wherein the display displays a first reconstructed image corresponding to the first image acquired on the first illumination condition, a second reconstruction image corresponding to the second image acquired on the second illumination condition, and a result of comparison between the first reconstructed image and the second reconstructed image.

13. A charged particle beam apparatus comprising:
a charged particle source;
an off-axis illumination aperture;
an objective lens;
a controller including a computer and a memory; and
an input/output unit including a display,
wherein an image is acquired by detecting a signal, generated by irradiating a sample with a charged particle beam caused from the charged particle source via the off-axis illumination aperture and the objective lens,
wherein the computer comprises
a beam-computing-processor configured to perform a beam computation process to estimate a beam profile of the charged particle beam; and
a sharpening processor configured to perform a sharpening process to sharpen the image using the estimated beam profile,
using a first image acquired on a first illumination condition, and a second image acquired on a second illumination condition, by
calculating a first optical transfer function corresponding to the first illumination condition with the sharpening process unit using the first image acquired on the first illumination condition;
calculating a Fourier image of the first image with the sharpening processor;
calculating a second optical transfer function corresponding to the second illumination condition with the sharpening processor using the second image acquired on the second illumination condition;
calculating a Fourier image of the second image with the sharpening processor; and
forming a sharpened Fourier image by selecting the first Fourier image or the second Fourier image, corresponding to the first optical transfer function or the second optical transfer function, with a higher gain, and combining the selected images, wherein the first illumination condition or the second illumination condition is obtained by changing any of optical system magnification of the charged particle beam apparatus, rotation of the off-axis illumination aperture in a direction parallel to the sample, and the aperture shape of the off-axis illumination aperture, and wherein the display displays the image and a sharpened image of the image sharpened using the estimated beam profile.

14. The charged particle beam apparatus according to claim 11, wherein the display displays the first image acquired on the first illumination condition and the second image acquired on the second illumination condition, and a sharpened image obtained using a high gain part of optical transfer functions of the first image and the second image in respective spatial frequency regions.

* * * * *